(12) United States Patent
Koriyama

(10) Patent No.: US 6,768,401 B2
(45) Date of Patent: Jul. 27, 2004

(54) WIRING BOARD WITH A WAVEGUIDE TUBE AND WIRING BOARD MODULE FOR MOUNTING PLURAL WIRING BOARDS

(75) Inventor: Shinichi Koriyama, Kokubu (JP)

(73) Assignee: Kyocera Corporation, Kyoto (JP)

( * ) Notice: Subject to any disclaimer, the term of this patent is extended or adjusted under 35 U.S.C. 154(b) by 157 days.

(21) Appl. No.: 10/104,979

(22) Filed: Mar. 21, 2002

(65) Prior Publication Data

US 2002/0140532 A1 Oct. 3, 2002

(30) Foreign Application Priority Data

Mar. 22, 2001 (JP) ........................................ 2001-083749

(51) Int. Cl.[7] .............................. H01P 3/18; H01P 1/10
(52) U.S. Cl. ...................................... 333/248; 333/254
(58) Field of Search ................................ 333/239, 248, 333/254

(56) References Cited

U.S. PATENT DOCUMENTS 4,963,844 A * 10/1990 Konishi et al. ............. 333/208
5,917,232 A * 6/1999 Tanizaki et al. ......... 333/248 X
5,982,256 A * 11/1999 Uchimura et al. .......... 333/239

FOREIGN PATENT DOCUMENTS

| JP | 6053711 | * | 2/1994 | .................. 333/239 |
| JP | 6224604 | * | 8/1994 | .................. 333/248 |
| JP | 11-074701 | | 3/1999 | |
| JP | 11-074702 | | 3/1999 | |

* cited by examiner

Primary Examiner—Benny T. Lee
(74) Attorney, Agent, or Firm—Hogan&Hartson (57) ABSTRACT

A wiring board module has two wiring boards placed on an external circuit board. In each wiring board, a terminal end of a laminated waveguide tube is exposed at a lateral side of a dielectric substrate, thus forming an exposed face, and the dielectric substrate is provided at the bottom thereof in the vicinity of the exposed face with connection pads to be used for mounting the wiring board on the surface of the external circuit board. The exposed faces of the laminated waveguide tubes of the two wiring boards are contacted with each other, and the connection pads at the bottoms of the wiring boards are connected and fixed to connection pads disposed on the surface of the external circuit board.

9 Claims, 7 Drawing Sheets

PRIOR ART

WIRING BOARD WITH A WAVEGUIDE TUBE AND WIRING BOARD MODULE FOR MOUNTING PLURAL WIRING BOARDS

This application is based on application No. 200-1083749 filed in Japan, the content of which is incorporated hereinto by reference.

BACKGROUND OF THE INVENTION

1. Field of the Invention

The present invention relates to a wiring board which is used for a frequency domain of a microwave or a millimeter wave and which can be mounted on an external circuit board, and also relates to a wiring board module formed by combining a plurality of such wiring boards with one another. The wiring board and the wiring board module of the present invention are applied, for example, to an electric wave system using a millimeter wave such as a radar for measuring the distance between two vehicles.

2. Description of Related Art

In this advanced information age, it is now under examination how to utilize as an electric wave for communication, an electric wave whose frequency is in a range from a microwave domain of 1 to 30 GHz to a millimeter wave domain of 30 to 300 GHz.

In such a high frequency system, because the frequency is high, a high frequency signal is highly attenuated. tenuated. Accordingly, a transmission line made of a low-loss material is used for every line through which a high frequency signal passes. Conventionally, there has been formed a multichip module in which high frequency elements are mounted on a wiring board made of material such as high-purity alumina which is small in dielectric loss tangent tan δ, and this wiring board and a connection board made of a similar material are bonded and connected to a metallic chassis.

Figure 7:
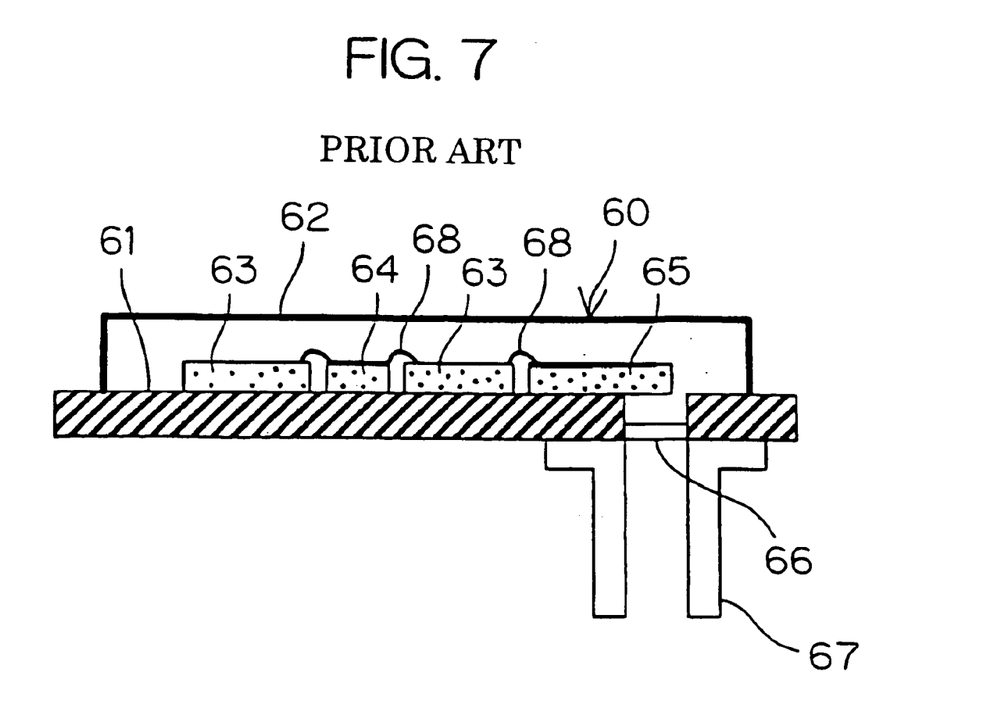
FIG. 7 is a schematic section view illustrating the structure of a multichip module of prior art.

FIG. 7 is a schematic section view illustrating the structure of such a multichip module. As shown in FIG. 7, a multichip module 60 comprises a metallic chassis 61, a lid 62, a plurality of high frequency elements 63 disposed inside of the lid 62, a connection board 64 and a waveguide tube conversion microstrip line board 65. The high frequency elements 63 are connected to the connection board 64 and/or the waveguide tube conversion microstrip line board 65 with wire bondings 68. The metallic chassis 61 has a waveguide opening, to which a dielectric window 66 is brazed for a hermetical sealing. A connection waveguide tube 67 is connected to the waveguide opening.

In such a multichip module, a number of high frequency elements are mounted on a single metallic chassis, resulting in an increase in the size of the metallic chassis. Accordingly, the metallic chassis and the lid are readily deformed, thus introducing the danger of the hermetical sealing being ruined. To form one module, it is required to connect each high frequency element to each wiring with the use of a gold wire or a gold ribbon 68. Accordingly, even a single defective connection makes the whole module defective. This adversely affects module production yield.

To solve the above-mentioned problem, it is proposed to form a module by hermetically housing a plurality of high frequency elements in a plurality of packages, respectively and by mounting such a plurality of packages on the surface of a predetermined module substrate.

When forming a wiring board module by surface-mounting, on the surface of a module substrate, wiring boards such as packages having high frequency elements mounted thereon, the wiring boards are connected to one another by a wiring layer formed on the surface of the module substrate, and signal transmission is made through this wiring layer. In such a case, when the signal frequency is high, a high frequency signal reflects at the connection parts of the wiring boards with the wiring layer of the module substrate, thus disadvantageously causing the high frequency signal to be readily attenuated.

Further, when a composite material such as a glass-epoxy resin composite material is used as the material of a module substrate, the dielectric loss tangent which causes a high frequency signal to be adversely attenuated on the surface of the module substrate. However, when a material small in dielectric loss tangent is used as the module substrate material, the cost becomes extremely expensive.

It is therefore desired to realize a wiring board and a wiring board module, both of which are low in cost and loss, and which can be used for a high frequency domain.

SUMMARY OF THE INVENTION

It is an object of the present invention to provide a wiring board arranged such that when high frequency elements are mounted thereon, signal transmission among a plurality of such wiring boards can be made without a wiring layer on the surface of a module substrate serving as an intermediary. In addition, it is an object of the present invention to provide a module substrate which is made of an ordinary, economical substrate such as a glass-epoxy resin composite material. Furthermore, it is an object of the present invention to provide a wiring board module which has excellent transmission characteristics, and uses such wiring boards.

A wiring board of the invention has a laminated waveguide tube comprising: a pair of conductor layers parallel to the top surface and the underside of at least one dielectric layer of a dielectric substrate having one dielectric layer or a plurality of laminated dielectric layers; and lateral-wall via-hole conductor groups arranged in two rows in a line direction at an interval of less than ½ of a signal wavelength, the conductor layers being electrically connected to each other by the lateral-wall via-hole conductor groups. In the wiring board, a terminal end of the laminated waveguide tube is exposed at a lateral side of the dielectric substrate, thus forming an exposed face. The dielectric substrate is provided at the bottom thereof in the vicinity of the exposed face with connection pads to be used for mounting the wiring board on the surface of an external circuit board.

A wiring board module of the invention comprises: two wiring boards each having the arrangement above-mentioned with their exposed faces of the laminated waveguide tubes contacted with each other; and an external circuit board on which these two wiring boards are placed, the connection pads at the bottoms of the wiring boards being connected and fixed to connection pads formed on the surface of the external circuit board.

According to the present invention, terminal ends of the laminated waveguide tubes are exposed at lateral sides of the wiring boards, and with these exposed faces contacted with each other, the wiring boards are surface-mounted on the surface of a module substrate. Accordingly, a high frequency signal of a microwave or a millimeter wave can be transmitted directly from one wiring board to the other wiring board without an intermediary of connection parts of the wiring boards to the module substrate or a wiring layer on the module substrate. This achieves a low loss high frequency transmission between the wiring boards regardless of the dielectric loss tangent and dielectric constant of the module substrate.

Further, an economical module substrate can be used, and mounting the wiring boards on the surface of a module substrate improves productivity. It is therefore possible to obtain a low-cost wiring board module.

Further, according to the present invention, a notch can be formed in both or one of the exposed faces to come in contact with each other, and is filled with adhesives having predetermined dielectric properties. This enhances the bonding properties of the wiring boards, thus further improving the transmission characteristics.

In the following, the description will discuss the specific arrangements of the wiring board and the wiring board module of the present invention with reference to the attached drawings.

DESCRIPTION OF THE PREFERRED EMBODIMENTS

Figure 1A:
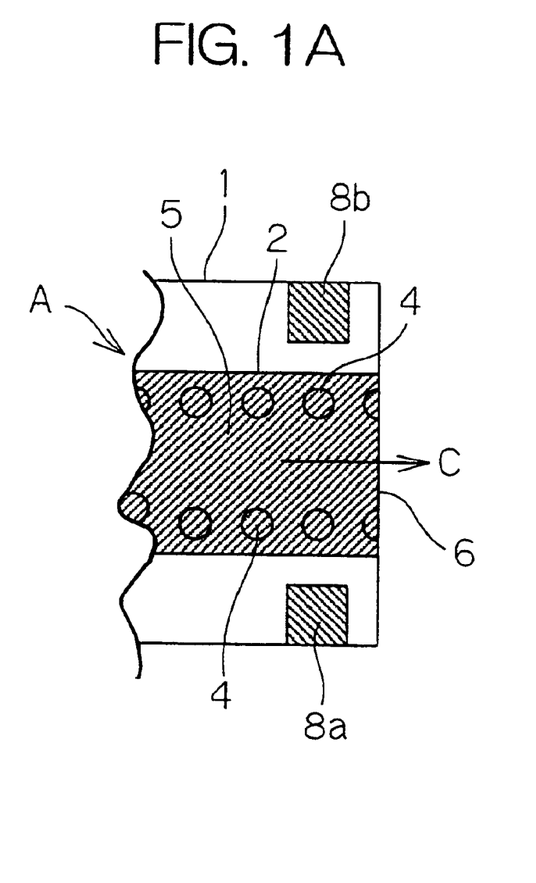
FIG. 1A is a schematic bottom view illustrating an example of a wiring board according to the present invention.
Figure 1B:
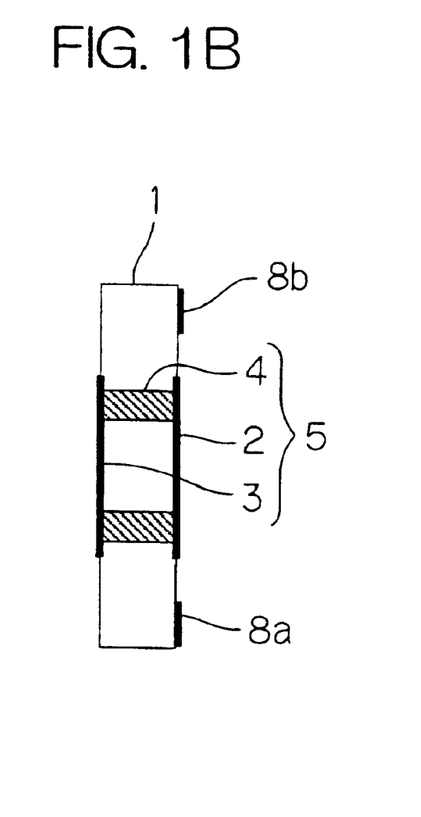
FIG. 1B is a schematic side view of the wiring board in FIG. 1A.

FIG. 1A is a schematic bottom view illustrating an example of a wiring board A of the present invention, while FIG. 1B is a schematic side view of FIG. 1A.

The wiring board A (see FIG. 1A) has a dielectric substrate 1 having one dielectric layer or a plurality of laminated dielectric layers, and a pair of conductor layers 2, 3 (see FIG. 1B) parallel to the top face and the underside of the dielectric substrate 1. The conductor layers 2, 3 are mutually electrically connected to each other by lateral-wall via-hole conductors 4 arranged in two rows in a line direction C (see FIG. 1A) at an interval less than ½ of a signal wavelength. The conductor layers 2, 3 and the lateral-wall via-hole conductors 4 serve as a waveguide tube wall. This forms a so-called laminated-structure dielectric waveguide tube (hereinafter referred to as laminated waveguide tube) 5. By adjusting the dielectric constant and thickness of the dielectric substrate 1 and the row distance of the two-row via-hole conductors 4, this laminated waveguide tube 5 makes it possible to transmit, in the wiring board, a high frequency signal having the desired frequency.

A terminal end of the laminated waveguide tube 5 is exposed to the lateral side of the wiring board A, and this exposed face 6 (see FIG. 1A) serves as a bonding face to be bonded to another wiring board. At the bottom of the wiring board A in the vicinity of the exposed face 6, connection pads 8a, 8b to be used for mounting the wiring board A on a module substrate to be discussed later, are disposed at both sides of the laminated waveguide tube 5.

Figure 2:
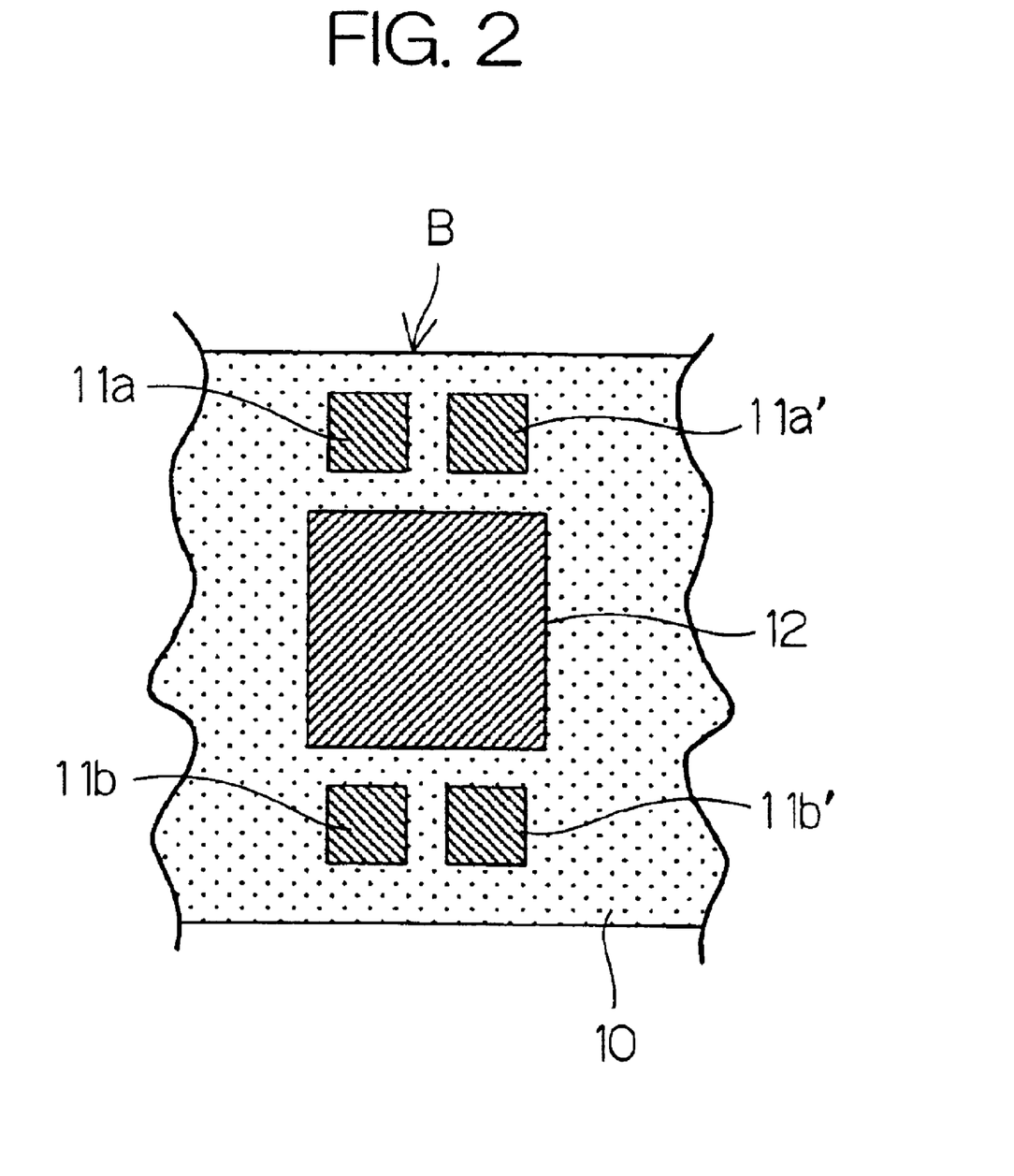
FIG. 2 is a plan view of a module substrate to be used for a wiring board module.

FIG. 2 is a plan view of a module substrate B on which the wiring board A shown in FIG. 1A is mounted. Disposed on the surface of a dielectric substrate 10 of the module substrate B are connection pads 11a, 11b to be connected to the connection pads 8a, 8b formed at the bottom of the wiring board A. Also disposed on the surface of the dielectric substrate 10 are connection pads 11a', 11b', opposite to the connection pads 11a, 11b, to be used for mounting a wiring board Al having a structure similar to that of the wiring board A (not shown).

Disposed between the connection pads 11a, 11a' and the connection pads 11b, 11b' is a conductor layer 12 having a width equivalent to the row distance of the via-hole conductors 4 of the laminated waveguide tube 5. The conductor layer 12 is disposed for electrically connecting, to each other, the conductor layers 2 of the laminated waveguide tubes 5 of the wiring boards A, A'.

Figure 3A:
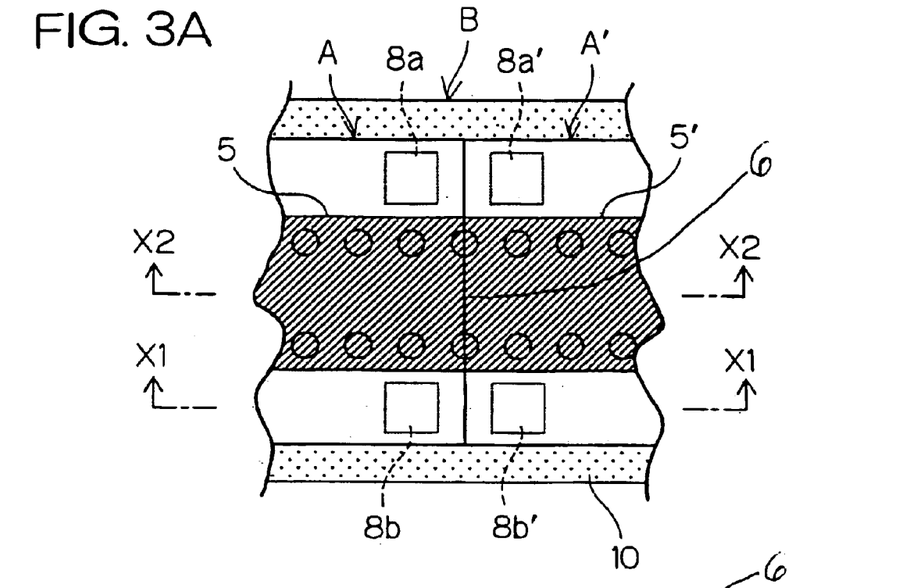
FIG. 3A is a schematic plan view of a wiring board module.
Figure 3B:
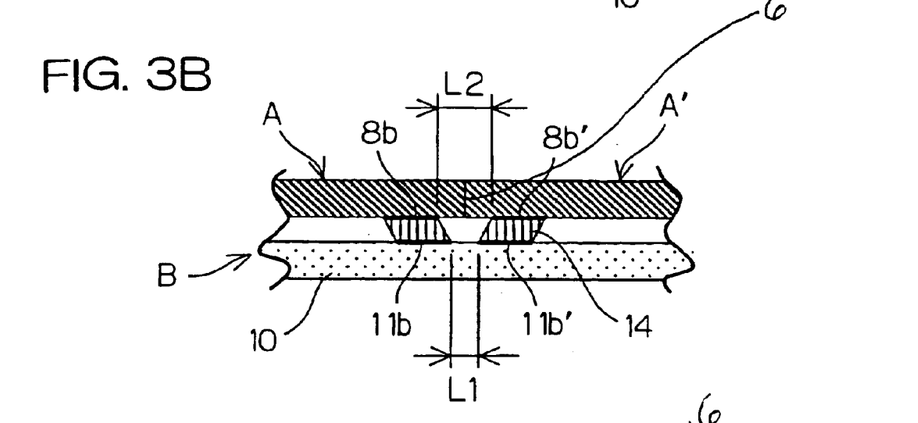
FIG. 3B is a section view taken along the line $X_1$—$X_1$ of the wiring board module in FIG. 3A.
Figure 3C:
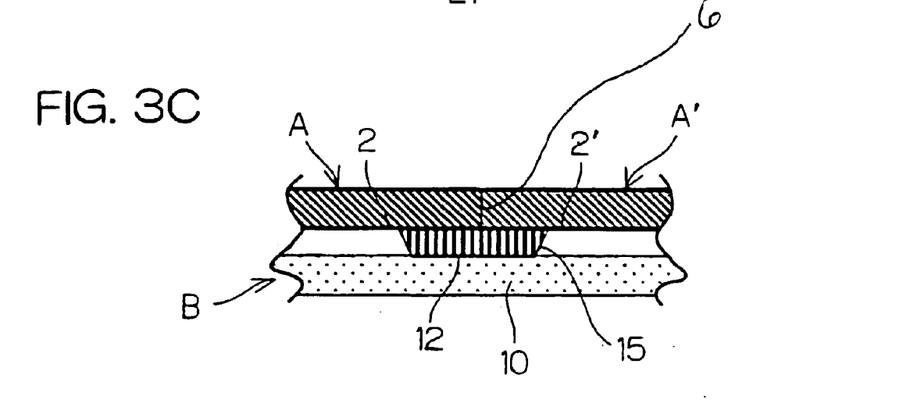
FIG. 3C is a section view taken along the line $X_2$—$X_2$ of the wiring board module in FIG. 3A.

The following description will discuss the wiring board module of the present invention. FIG. 3A is a schematic plan view of a wiring board module in which the wiring boards A, A' are mounted on the surface of the module substrate B in FIG. 2. FIG. 3B is a section view taken along the line $X_1$—$X_1$, and FIG. 3C is a section view taken along the line $X_2$—$X_2$. Like parts used in FIGS. 3A, 3B, and 3C are designated by like reference numerals used in FIGS. 1A, 1B, and 2 with similar description omitted. In FIGS. 3A, 5 and 5' represent the waveguide tubes of wiring boards A and A', respectively.

In the wiring board module in FIGS. 3A and 3B, the connection pads 8a, 8b, 8a', 8b' of the wiring boards A, A' are connected and fixed to the connection pads 11a (FIG. 2), 11b, 11a', 11b' (FIG. 3B) of the module substrate B with brazing materials 14 (FIG. 3B). The conductor layers 2, 2' of the wiring boards A, A' are electrically connected to the conductor layer 12 with a brazing material 15 as shown in FIG. 3C. The wiring boards A, A' are secured to the module substrate B by the brazing material 15.

According to the present invention, as shown in FIG. 3B, the shortest distance L1 between the connection pads 11a (not shown herein), 11a' and between the connection pads 11b, 11b' of the module substrate B, is preferably smaller than the shortest distance L2 between the connection pads 8a, 8a' and between the connection pads 8b, 8b' when the exposed faces 6 of the wiring boards A, A' come in contact with each other. Such positional shift between the connection pads generates stress which acts to mutually push the exposed faces 6 of the two wiring boards A, A' to each other, causing the wiring boards A, A' to be compressed. This enhances the bonding properties of the exposed faces 6 of the wiring boards A, A'.

It is preferable that no substantial gap is present between the exposed faces 6 of the wiring boards A, A', but adhesives may be poured into the gap, if any, to join the exposed faces 6 to each other with adhesives.

Figures 4A, 4B, 4C:
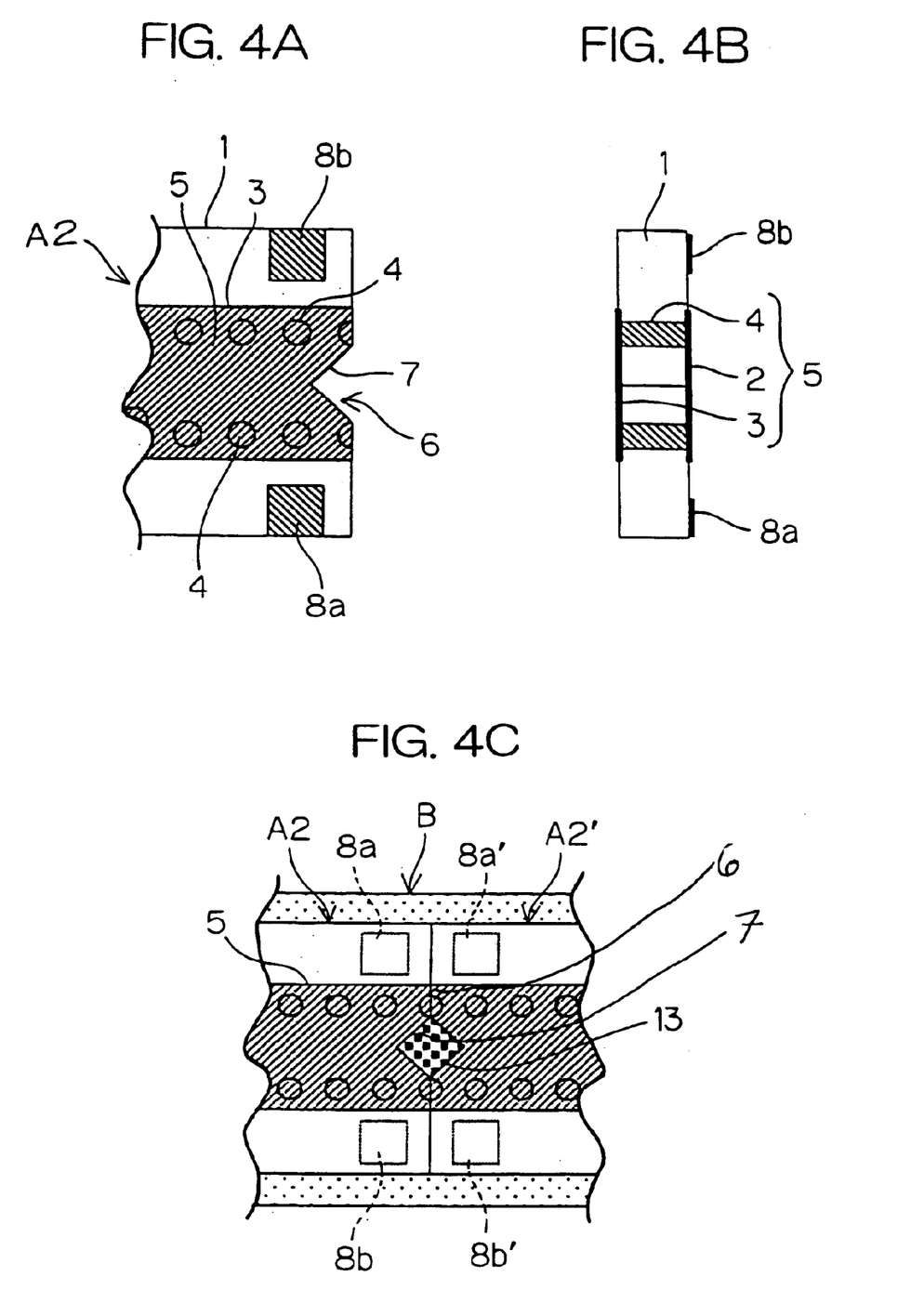
FIG. 4A is a schematic bottom view illustrating another example of the wiring board.
FIG. 4B is a schematic side view of the wiring board in FIG. 4A.
FIG. 4C is a plan view of a wiring board module.

FIG. 4A is a schematic bottom view illustrating another wiring board A2 of the present invention. FIG. 4B is a schematic side view, while FIG. 4C is a schematic plan view of a wiring board module. Like parts used in FIGS. 4A, 4B, and 4C are designated by like reference numerals used in FIGS. 1A, 1B, 2, 3A, 3B, and 3C with similar description omitted.

The wiring board A2 in FIG. 4A has a triangle notch 7 in its part corresponding to the exposed face 6 of the wiring board A in FIG. 1A. When the wiring boards A2, A2' are mounted on the surface of a module substrate B, the notches 7 are filled with dielectric adhesives 13 as shown in FIG. 4C. This further enhances the mutual adhesion and bonding properties of the wiring boards A2, A2'.

In FIG. 4C, the notch 7 is formed in the exposed face 6 of each wiring board A2, A2', but may be formed in the exposed face 6 of either wiring board A2 or A2'.

The relative dielectric constant $\in_1$ of the dielectric adhesives 13 filled in the notch 7, is preferably in the range of 0.5 to 2 times of the average relative dielectric constant $\in_0$ of the dielectric substrates 1, 1' of the wiring boards A2, A2'. If the relative dielectric constant $\in_1$ deviates from the range above-mentioned, a high frequency signal reflects at the exposed faces 6. This may possibly have an adverse effect on the transmission characteristics of the high frequency signal between the wiring boards A2, A2'.

Figure 5A:
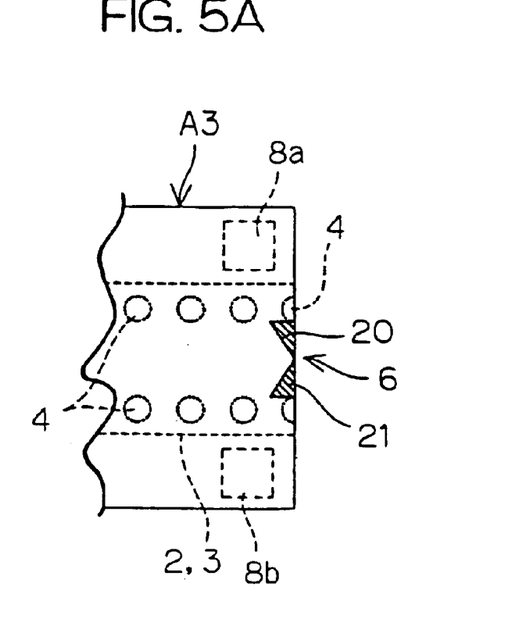
FIG. 5A is a schematic bottom view illustrating a further example of the wiring board.
Figure 5B:
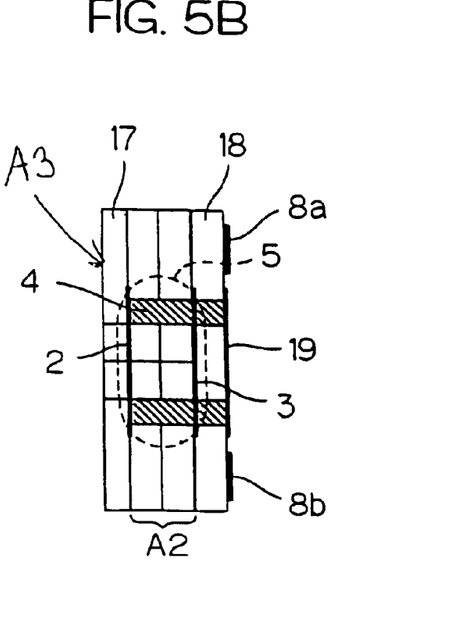
FIG. 5B is a schematic side view of the wiring board in FIG. 5A.
Figure 5C:
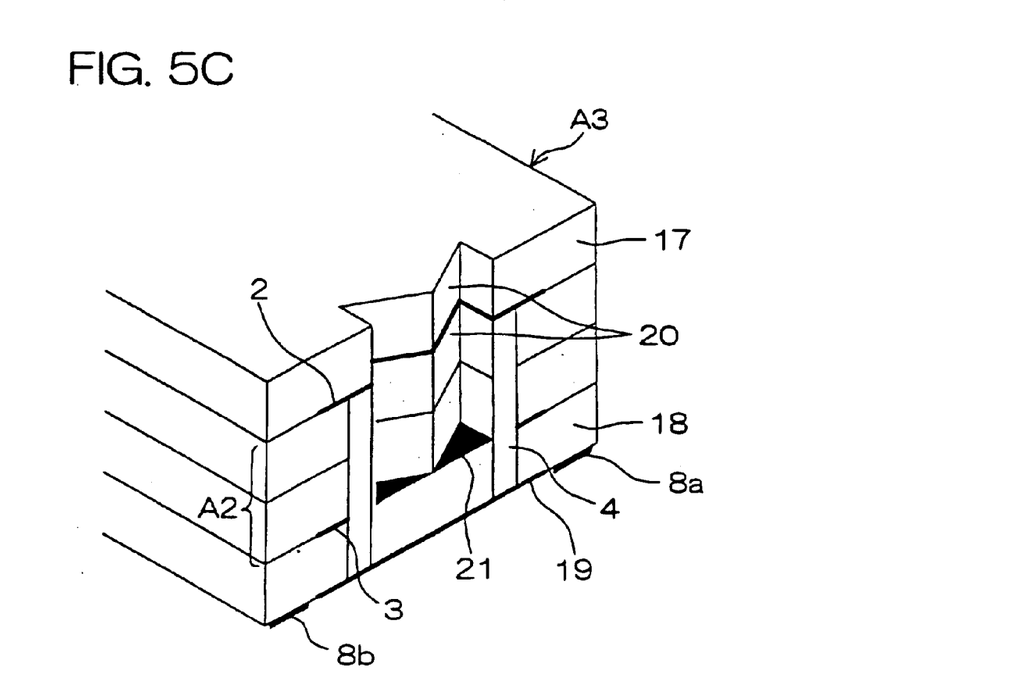
FIG. 5C is a perspective view of the wiring board in FIG. 5A.

FIGS. 5A, 5B, 5C show a further wiring board A3 of the present invention. FIG. 5A is a schematic plan view, FIG. 5B is a schematic side view, and FIG. 5C is a perspective view. Like parts used in FIGS. 5A, 5B, and 5C are designated by like reference numerals used in FIGS. 1A, 1B, 1B, 2, 3A, 3B, 3C, 4A, 4B, and 4C with similar description omitted.

According to the wiring board A3, dielectric layers 17, 18 (see FIGS. 5B, 5C) are respectively laminated on the top surface and at the underside of the wiring board having a laminated waveguide tube 5 (see FIG. 5B). A conductor layer 19 (see FIGS. 5B, 5C) is formed at the underside of the dielectric layer 18 of the wiring board A3, and the via-hole conductors 4 of the laminated waveguide tube 5 downwardly extend and are connected to the conductor layers 19. An M-shape notch 20 (see FIGS. 5A, 5C) is formed in the dielectric layer 17 and the exposed face 6 of the laminated waveguide tube 5. At the stepped face of the dielectric layer 18 facing the notch 20, a conductor layer 21 (see FIGS. 5A, 5C) is disposed to prevent a high frequency signal from leaking from this stepped connection part.

Figure 6A:
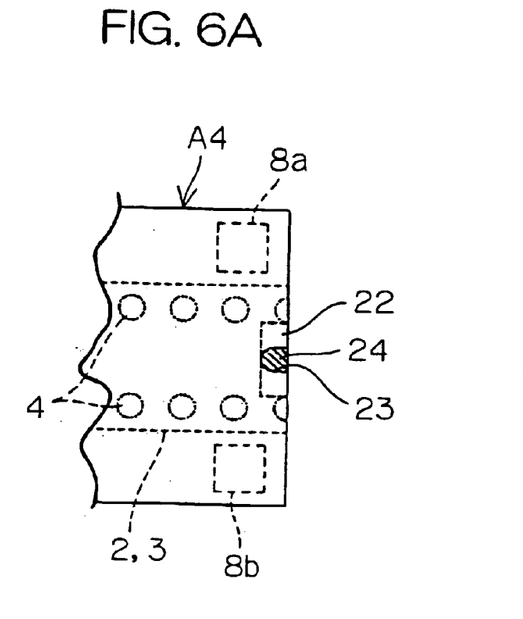
FIG. 6A is a schematic bottom view illustrating still another example of the wiring board.
Figure 6B:
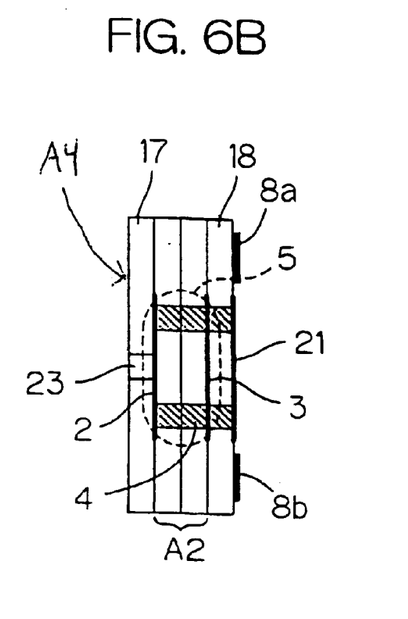
FIG. 6B is a schematic side view of the wiring board in FIG. 6A.
Figure 6C:
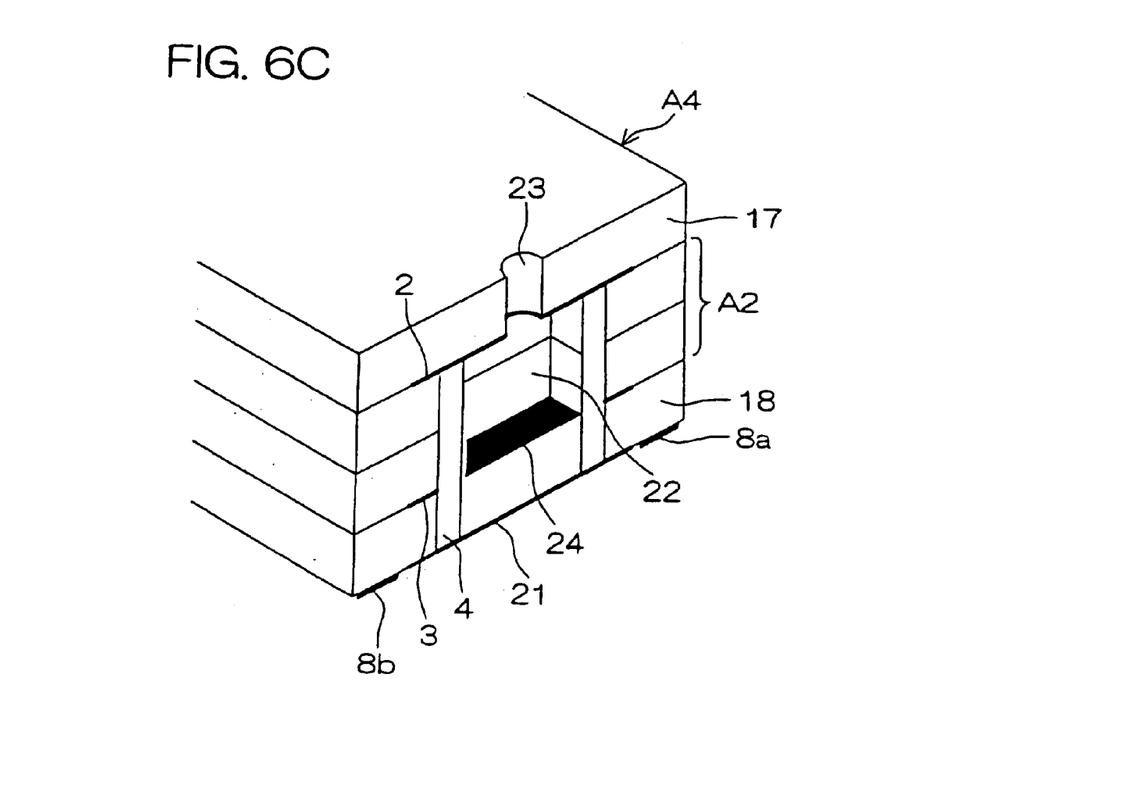
FIG. 6C is a perspective view of the wiring board in FIG. 6A.

FIGS. 6A, 6B, 6C show still another wiring board A4 of the present invention. FIG. 6A is a schematic plan view, FIG. 6B is a schematic side view, and FIG. 6C is a perspective view. Like parts used in FIGS. 6A, 6B, and 6C are designated by like reference numerals used in FIGS. 1A, 1B, 2, 3A, 3B, 3C, 4A, 4B, 4C, 5A, 5B, and 5C with similar description omitted.

According to the wiring board A4, dielectric layers 17, 18 (see FIGS. 6B, 6C) are respectively laminated on the top and at the underside of the wiring board having laminated waveguide tube 5 (see FIG. 6B).

A notch 22 (see FIGS. 6A, 6C) is formed in the exposed face of the laminated waveguide tube 5, and at least one dielectric layer 17 out of the dielectric layers 17, 18 sandwiching the laminated waveguide tube 5, is provided with an inlet port 23 (see FIGS. 6A, 6C) into which adhesives are injected after two exposed faces come in contact with each other. In this case, too, a conductor layer 24 is preferably formed on the stepped face of the dielectric layer 18 facing the notch 20.

According to the arrangement of each of FIGS. 1A, 1B; 2; 3A, 3B, 3C; 4A, 4B, 4C; 5A, 5B, 5C; 6A, 6B, 6C, a high frequency signal of a microwave or a millimeter wave can be transmitted directly from the wiring board A to the other wiring board A' in contact therewith, through the exposed faces 6 thereof. This enables high frequency transmission to be successfully executed between the wiring boards A, A' regardless of the design rule and the dielectric characteristics of the dielectric substrate 10 of the module substrate B.

In each of the above-mentioned wiring boards and wiring board modules, the dielectric substrate can be made of ceramics, an organic resin or a composite material of ceramics and an organic resin. In particular, in view of the transmission characteristics, the dielectric substrate is preferably made of a low dielectric loss material and more preferably ceramics.

Examples of the ceramics include a ceramics material such as $Al_2O_3$, AlN, $Si_3N_4$, a glass material and a glass-ceramics composite material comprising glass and an inorganic filler such as $Al_2O_3$, $SiO_2$, MgO. The dielectric substrate 1 is formed by molding such raw material powder into a predetermined substrate shape and then calcining the resulting molded body. Using an organic resin, the dielectric substrate 1 may be formed by a print substrate or a Teflon substrate made of an organic material.

The conductor layers 2, 3, and the via-hole conductors 4 can be made of a high-melting-point metal such as tungsten, molybdenum or the like, and a low-resistance metal such as gold, silver, copper or the like. With any of these materials suitably selected dependent on the substrate material used, the conductor layers 2, 3 and the via-hole conductors 4 can be formed integrally with the dielectric substrate 1 with the use of a conventional lamination technology.

For example, when the substrate is made of a ceramics material such as $Al_2O_3$, AlN, $Si_3N_4$ or the like, a high-melting-point metal such as tungsten, molybdenum or the like may be applied to an uncalcined body, and this uncalcined body may be calcined at temperature of 1500 to 1900° C. When the substrate is made of a glass material or a glass-ceramic material, copper, gold or silver may be applied to an uncalcined body, and this uncalcined body may be calcined at temperature of 800 to 1100° C. When the substrate is made of an insulating material comprising an organic resin, lines and a ground layer may be formed by applying a paste with the use of copper, gold, silver, or by gluing a metallic foil. The via-hole conductors may be formed by forming through-holes in an uncalcined molded body, filling these through-holes with a conductor paste and simultaneously calcining the molded body and the conductor paste.

The module substrate may be made of ceramics, an organic resin and a composite material of ceramics and an organic resin. According to the present invention, however, there may be used a material relatively high in dielectric loss since a high frequency signal is not transmitted on the surface of the module substrate. For example, the module substrate may be made of a glass-epoxy resin composite material comprising an organic resin.

The wiring board and the wiring board module using the same of the present invention are effective for transmission of a signal of which frequency is 10 GHz or more, and more effective for frequency of 30 GHz or more, and much more effective for frequency of 60 GHz.

EXAMPLE

To confirm the operational effect of the present invention, the following tests were conducted. By a usual lamination simultaneous calcining technique, wiring boards as shown in FIGS. 1 and 4 were prepared with the use of a tungsten metalized ink and a green sheet of alumina ceramics of which relative dielectric constant was 9 and dielectric loss tangent was 0.0006 at 10 GHz after calcination. To those exposed faces of the wiring boards which are opposite to the mutual contact faces thereof, metal fittings each having an opening identical with that of a standard waveguide tube WR-1, were brazed with silver solder and then subjected to nickel-gold plating.

On the other hand, as each module substrate forming an outer circuit board, there was used a print substrate FR-4 which has a conductor pattern as shown in FIG. 2 and which is made of a glass-epoxy resin composite material.

Solder paste of the tin-silver-copper type was printed on the connection pads of the print substrates. With the exposed faces of the wiring boards being contacted with each other, the wiring boards were subjected to reflow-mounting, thus forming evaluation samples.

The distances L2 between the connection pads of the wiring boards with their exposed faces coming in contact with each other, were set to 3 mm, while the shortest distance L1 between the connection pads of the module substrates, were set to 2 mm.

After the reflow-mounting, the notches 7 were filled with a composite material formed by mixing a thermosetting resin having a relative dielectric constant of 9 with strontium titanate powder.

Measuring waveguide tubes were connected to those exposed faces of the wiring boards of the evaluation samples which are opposite to the mutual contacted faces thereof. Then, by measuring the insertion losses at 76 GHz, there were estimated the losses at the mutual contacted faces of the wiring boards of the evaluation samples.

In the wiring board module using the wiring boards having no notch, the loss at the contacted faces at 76 GHz was about 1.8 dB. On the other hand, in the wiring board module using the wiring boards having a notch, the loss was about 1.1 dB. It was thus confirmed that each of the losses above-mentioned was sufficiently small in view of production of a practical module.

What we claim is:

1. A wiring board comprising a laminated waveguide tube having: a pair of conductor layers parallel to the top surface and the underside of at least one dielectric layer of a dielectric substrate having one dielectric layer or a plurality of laminated dielectric layers; and lateral-wall via-hole conductor groups arranged in two rows in a line direction at an interval of less than ½ of a signal wavelength, said conductor layers being electrically connected to each other by said lateral-wall via-hole conductor groups, a terminal end of said laminated waveguide tube being exposed at a lateral side of said dielectric substrate, thus providing an exposed face, and said dielectric substrate being provided at the bottom thereof in the vicinity of said exposed face with connection pads to be used for mounting said wiring board on the surface of an external circuit board.

2. A wiring board according to claim 1, wherein a notch is between said two-row via-hole conductors in said exposed face of said laminated waveguide tube of said wiring board.

3. A wiring board module comprising:

a first wiring board comprising a laminated waveguide tube having: a pair of conductor layers parallel to the top surface and the underside of at least one dielectric layer of a dielectric substrate having one dielectric layer or a plurality of laminated dielectric layers; and lateral-wall via-hole conductor groups arranged in two rows in a line direction at an interval of less than ½ of a signal wavelength, said conductor layers being electrically connected to each other by said lateral-wall via-hole conductor groups, a terminal end of said laminated waveguide tube being exposed at a lateral side of said dielectric.substrate, thus providing an exposed face, said dielectric substrate being provided at the bottom thereof in the vicinity of said exposed face with connection pads to be used for mounting said first wiring board on the surface of an external circuit board;

said second wiring board being mounted to said external circuit board said external circuit board on which said two wiring boards are placed;

said exposed faces of said laminated waveguide tubes of said first and second wiring boards being contacted with each other, and said connection pads at the bottoms of said wiring boards being connected and fixed to connection pads disposed on the surface of said external circuit board.

4. A wiring board module according to claim 3, wherein said connection pads at the bottoms of said wiring boards are connected and fixed to said connection pads disposed on the surface of said external circuit board with brazing materials.

5. A wiring board module according to claim 3, wherein the distance between the connection pads disposed on the surface of said external circuit board is smaller than the distance between the connection pads of said first and second wiring boards when said exposed faces thereof are contacted with each other.

6. A wiring board module according to claim 3, wherein a respective notch is disposed in at least one of said exposed faces of said first and second wiring boards, and said respective notch is filled with dielectric adhesives such that said exposed faces of said first and second wiring board are glued to each other with said dielectric adhesives.

7. A wiring board module according to claim 6, wherein the relative dielectric constant $\epsilon_1$ of said dielectric adhesives filled in said respective notch, is in the range of 0.5 to 2 times of the average relative dielectric constant $\epsilon_0$ of said dielectric substrates of said first and second wiring boards.

8. A wiring board module according to claim 6, wherein said dielectric adhesives are comprised of a composite material of an organic resin and ceramics.

9. A wiring board module according to claim 3, wherein said external circuit board having a dielectric substrate which is comprised of a material comprising an organic resin.

* * * * *